(12) United States Patent
Hsu et al.

(10) Patent No.: US 6,960,503 B2
(45) Date of Patent: Nov. 1, 2005

(54) METHOD FOR FABRICATING A TRENCH CAPACITOR

(75) Inventors: Ping Hsu, Taipei Hsien (TW); Kuo-Chien Wu, Miao-Li (TW); Shih-Fan Kuan, Tao-Yuan Hsien (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 163 days.

(21) Appl. No.: 10/707,026

(22) Filed: Nov. 16, 2003

(65) Prior Publication Data

US 2005/0106831 A1    May 19, 2005

(51) Int. Cl.[7] .......................................... H01L 21/8242
(52) U.S. Cl. ...................... 438/243; 438/246; 438/387
(58) Field of Search ............................... 438/243–249, 438/386–392

(56) References Cited

U.S. PATENT DOCUMENTS 6,365,485 B1    4/2002  Shiao et al.
6,680,237 B2    1/2004  Chen et al.
6,815,307 B1 *  11/2004 Hsu et al. .................. 438/386

FOREIGN PATENT DOCUMENTS

TW    488067    5/2002
TW    508758    11/2002

* cited by examiner

Primary Examiner—Jack Chen
(74) Attorney, Agent, or Firm—Winston Hsu

(57) ABSTRACT

A method for making a deep trench capacitor is disclosed. A substrate with a deep trench formed therein is provided. The trench is doped to form a buried plate electrode serving as a first electrode of the deep trench capacitor at a lower portion of the trench. A node dielectric is formed on interior surface of the trench. Subsequently, the trench is filled with a first conductive layer and then recessed to a first depth. A collar oxide layer is then formed on vertical sidewall of the trench on the first conductive layer. The trench is filled with a second conductive layer and again recessed to a second depth. A pair of symmetric spacers is then formed on the vertical sidewall of the trench. A third conductive layer is deposited on the second conductive layer and on the symmetric spacers, and fills the trench. The trench is recessed to a third depth.

11 Claims, 15 Drawing Sheets

METHOD FOR FABRICATING A TRENCH CAPACITOR

BACKGROUND OF INVENTION

1. Field of the Invention

The present invention relates to a semiconductor process, and more particularly, to a process of manufacturing a deep trench capacitor of a DRAM device.

2. Description of the Prior Art

Trench-capacitor DRAM devices are known in the art. A trench-storage capacitor typically consists of a very-high-aspect-ratio contact-style hole pattern etched into the substrate, a thin storage-node dielectric insulator, a doped low-pressure chemical vapor deposition (LPCVD) polysilicon fill, and buried-plate diffusion in the substrate. The doped LPCVD silicon fill and the buried plate serve as the electrodes of the capacitor. A dielectric isolation collar in the upper region of the trench prevents leakage of the signal charge from the storage-node diffusion to the buried-plate diffusion of the capacitor.

In general, the prior art method for fabricating a trench capacitor of a DRAM device may include several major manufacture phases as follows:

Phase 1: deep trench etching.
Phase 2: buried plate and capacitor dielectric (or node dielectric) forming.
Phase 3: first polysilicon deep trench fill and first recess etching.
Phase 4: collar oxide forming.
Phase 5: second polysilicon deposition and second recess etching.
Phase 6: collar oxide wet etching.
Phase 7: third polysilicon deposition and third recess etching.
Phase 8: shallow trench isolation (hereinafter referred to as "STI") forming.

Please refer to FIG. 1 and FIG. 2. FIG. 1 and FIG. 2 are schematic cross-sectional diagrams showing several intermediate steps of forming a prior art deep trench capacitor, which are relative to the present invention. As shown in FIG. 1, a substrate 10 having a pad oxide layer 26 and a pad nitride layer 28 thereon is provided. After deep trench etching, an N⁺ buried plate 13 and a node dielectric layer 14 are sequentially formed in the deep trench. A first polysilicon deposition and recess process is then carried out to form a first poly layer (Poly1) at the bottom of the deep trench. A collar oxide layer 15 is formed on sidewall of the deep trench above Poly1. A second polysilicon deposition and recess process is then carried out to form a second poly layer (Poly2) atopPoly1. The collar oxide layer 15 that is not covered by Poly 2 is stripped off to expose the sidewall of the deep trench. Subsequently, as shown in FIG. 2, a third polysilicon deposition and recess process is carried out to form a third poly layer (Poly3) atopPoly 2 and collar oxide layer 15. Dopants of the heavily doped Poly 2 diffuse out through Poly 3 to the surrounding substrate 10 to form an annular shaped buried strap out diffusion regions 16 in the following thermal process. A conventional STI process is performed to isolate the two adjacent deep trench capacitors.

Please refer to FIG. 3. FIG. 3 is an enlarged schematic plane view showing the layout of the memory chip containing the trench capacitors made according to the prior art method as set forth in FIG. 1 and FIG. 2. The perspective buried strap out diffusion regions 16 encircling each of the trench capacitors 11 are also illustrated in FIG. 3, which are indicated with dash lines. As shown in FIG. 3, to achieve a maximum packing density, pairs of trench capacitors are arranged in very close distance.

Please refer to FIG. 4 to FIG. 6. FIG. 4 is an enlarged schematic plane view showing, in an ideal condition, the layout of the deep trench (DT) capacitors 11 and active area photoresist (AA photo) pattern without AA-DT misalignment. FIG. 5 is a schematic cross-sectional diagram showing the deep trench capacitor 11 and the AA photo along line NN" of FIG. 4, before STI etching. FIG. 6 is a schematic cross-sectional diagram showing the deep trench capacitor 11 and the shallow trench isolation (STI) along line NN" of FIG. 4. As shown in FIG. 4 and FIG. 5, in an ideal condition, the AA photo that is used to define active areas on the substrate and to define isolation shallow trenches to be etched into the substrate does not overlap with the annular buried strap out diffusion regions 16. As shown in FIG. 5, the AA photo is typically patterned on an intermediate dielectric layer such as a BSG layer using lithographic process known in the art. Using the AA photo and the BSG layer as an etching hard mask, STI trenches are etched into the substrate that is not masked by the AA photo pattern using dry etching such as RIE. After removing the remaining photoresist and BSG layer, STI fill material such as high-density plasma chemical vapor deposition (HDPCVD) oxide is then deposited into the STI trenches, followed by CMP planarization, thereby forming the structure as set forth in FIG. 6. It is noted that since the AA photo does not overlap with the buried strap out diffusion region of a neighboring deep trench capacitor in y direction, most of the buried strap out diffusion region surrounding the deep trench capacitor is etched away during the above-said STI process.

Please refer to FIG. 7 and FIG. 8. FIG. 7 is an enlarged schematic plane view showing, in a non-ideal condition, the layout of the deep trench (DT) capacitors 11 and active area photoresist (AA photo) pattern with AA-DT misalignment. FIG. 8 is a schematic cross-sectional diagram showing the deep trench capacitor 11 and the AA photo along line NN" of FIG. 7. In practice, misalignment between the AA photo and the deep trench capacitors 11 usually occurs. As shown in FIG. 7, the AA photo shifts a distance in y direction. This causes AA photo to overlap with the buried strap out diffusion regions 16 of neighboring deep trench capacitors. As shown in FIG. 8, after STI formation, the masked buried strap out diffusion region 16, which is not etched away during the STI process, will adversely affect the active areas and transistor characteristics.

SUMMARY OF INVENTION

Accordingly, the primary object of the present invention is to provide a method for fabricating a deep trench capacitor and trench capacitor memory devices, which is capable of avoiding the above-mentioned problems.

According to the claimed invention, a method for fabricating a trench capacitor is disclosed. A substrate having a deep trench etched therein is provided. The deep trench is then doped to form a buried plate electrode in the substrate adjacent to a lower portion of the deep trench. A node dielectric layer is formed on interior surface of the deep trench. A first conductive layer is thereafter deposited in the deep trench. The first conductive layer is then recessed to a first depth in the deep trench. A collar oxide layer is formed on sidewall of the deep trench above the first conductive layer. A second conductive layer is deposited on the first conductive layer and the collar oxide layer. The second conductive layer is recessed to a second depth inside the deep trench. A pair of symmetric spacers is formed on sidewall of the deep trench above the second conductive layer in a first direction and exposing a silicon sidewall of the deep trench above the second conductive layer in a second direction, wherein the first direction is substantially orthogonal to the second direction. A third conductive layer is then deposited on the second conductive layer and on the spacers, and recessed to a third depth inside the deep trench.

It is to be understood that both the foregoing general description and the following detailed description are exemplary, but are not restrictive, of the invention. Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
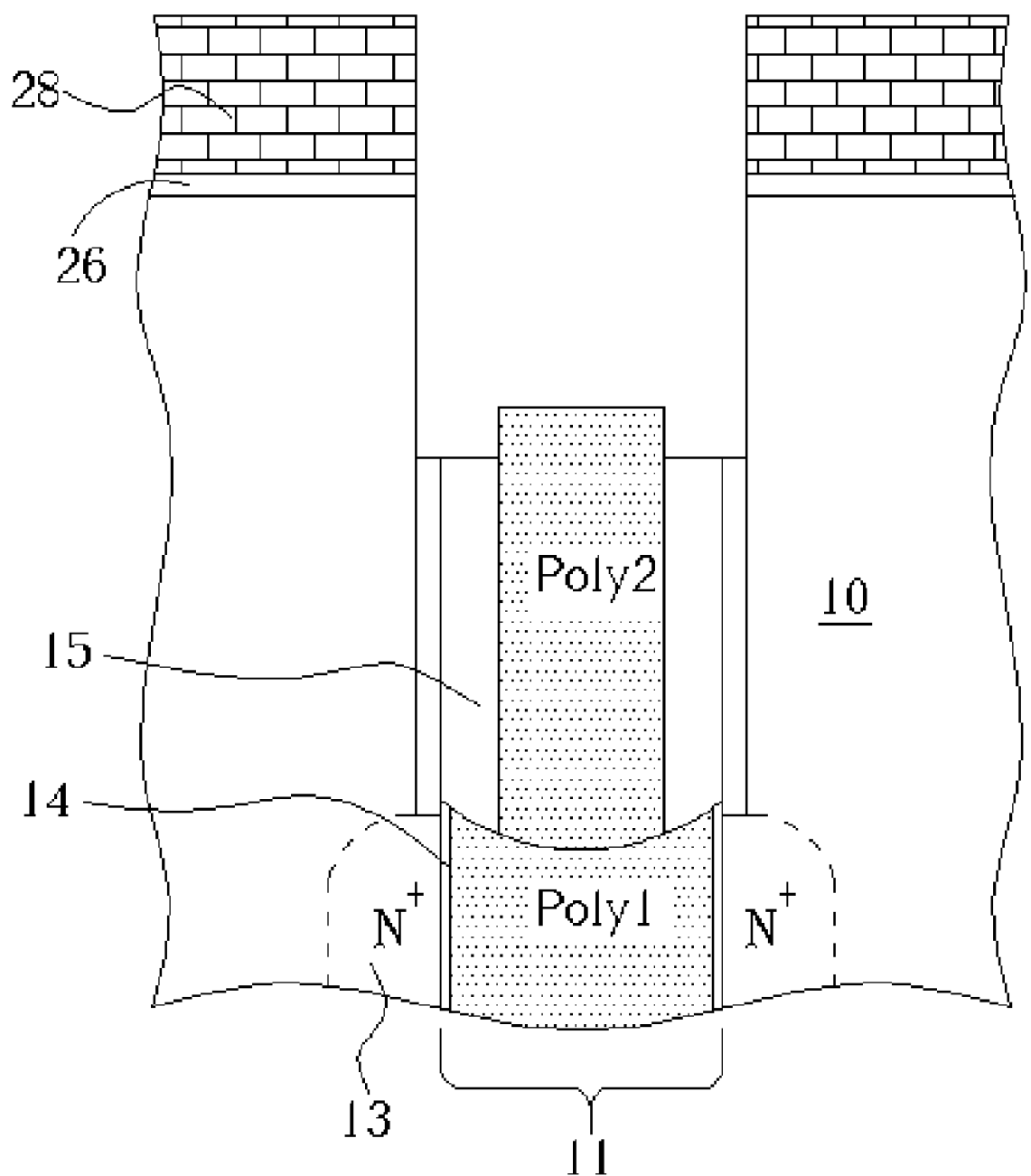
FIG. 1 and FIG. 2 are schematic cross-sectional diagrams showing several intermediate steps of forming a prior art deep trench capacitor (before STI process), which are relative to the present invention.
Figure 2:
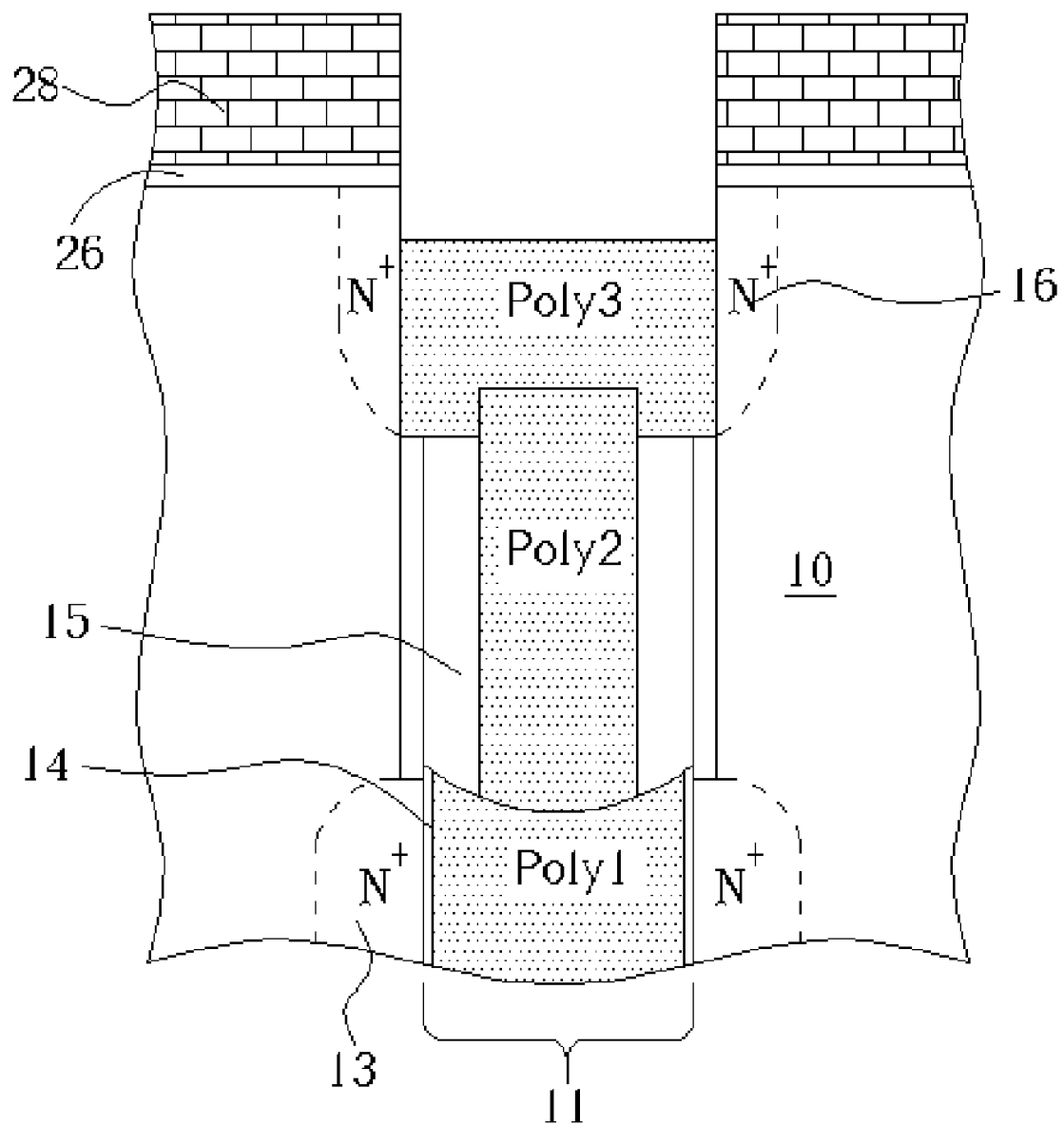
Figure 3:
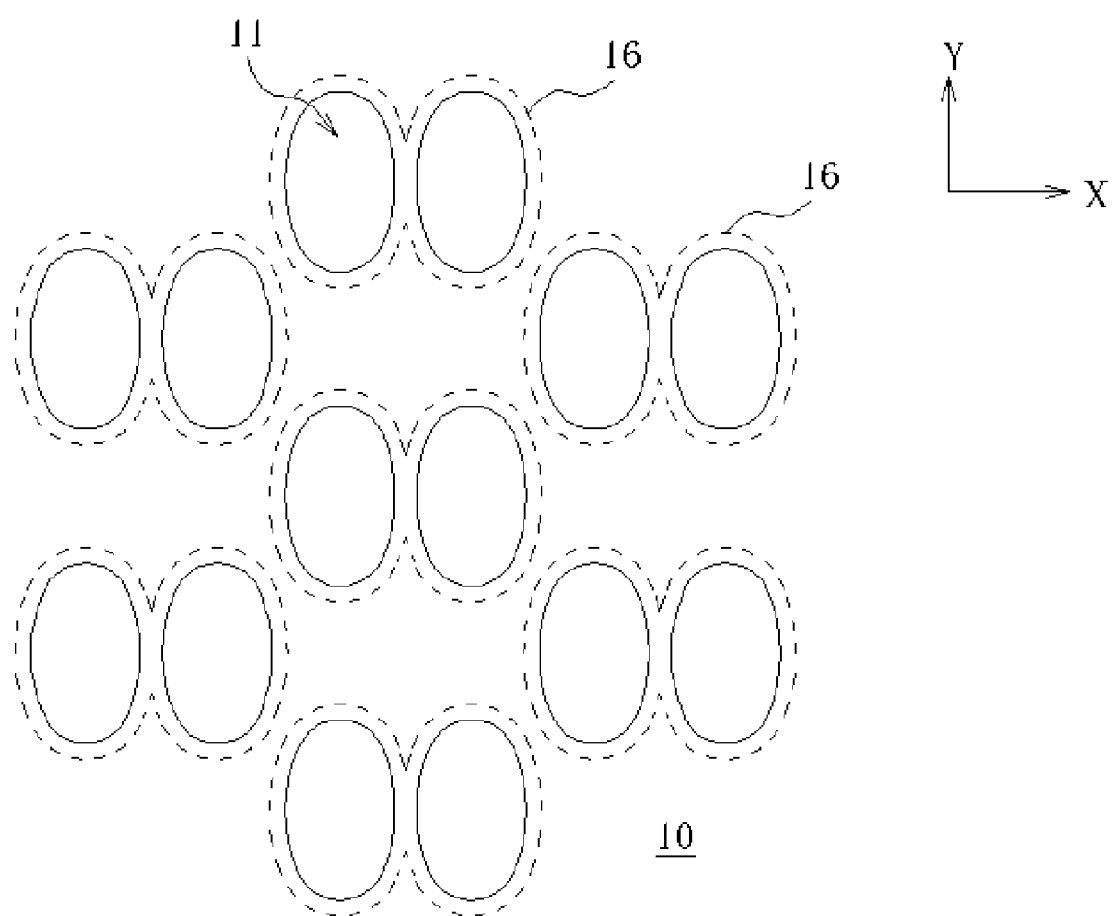
FIG. 3 is an enlarged schematic plane view showing the layout on the memory chip containing the trench capacitors made according to the prior art method as set forth in FIG. 1 and FIG. 2.
Figure 4:
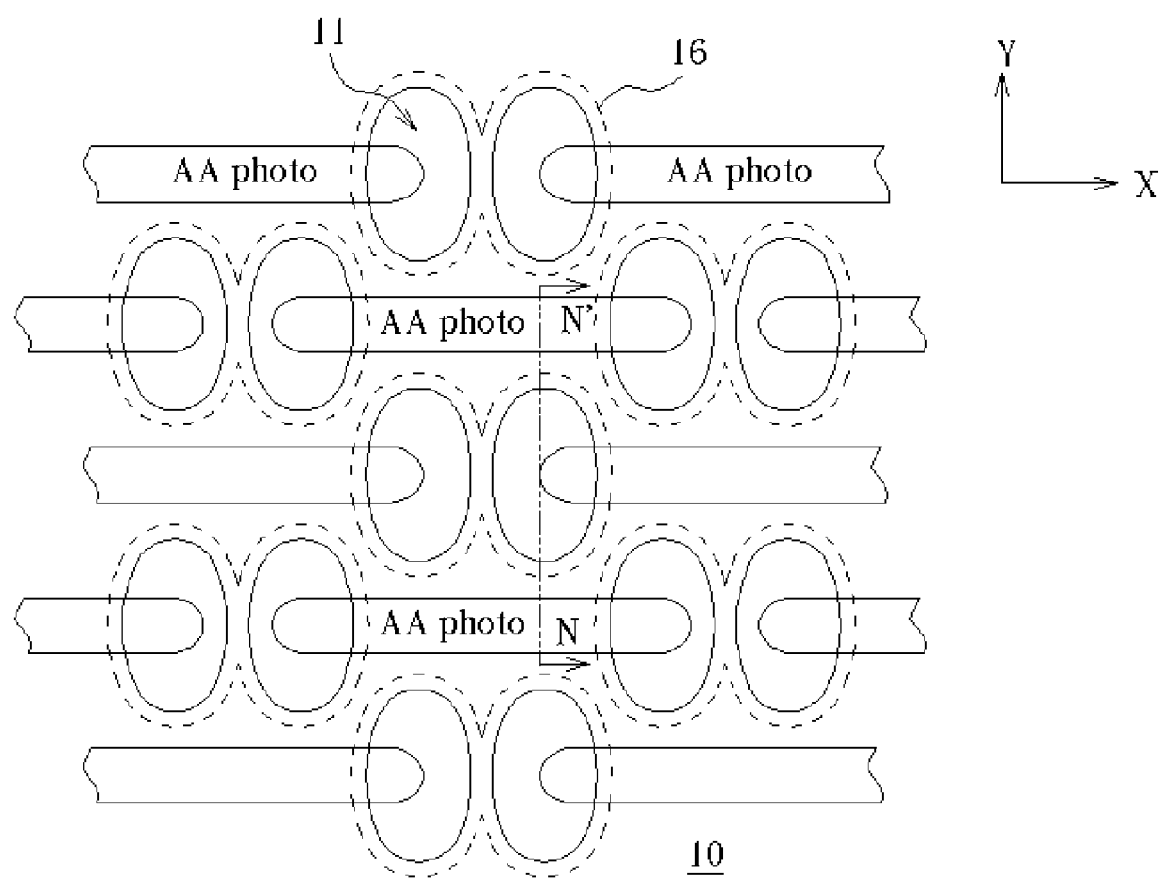
FIG. 4 is an enlarged schematic plane view showing, in an ideal condition, the layout of the deep trench (DT) capacitors and active area photoresist (AA photo) pattern without AA-DT misalignment.
Figure 5:
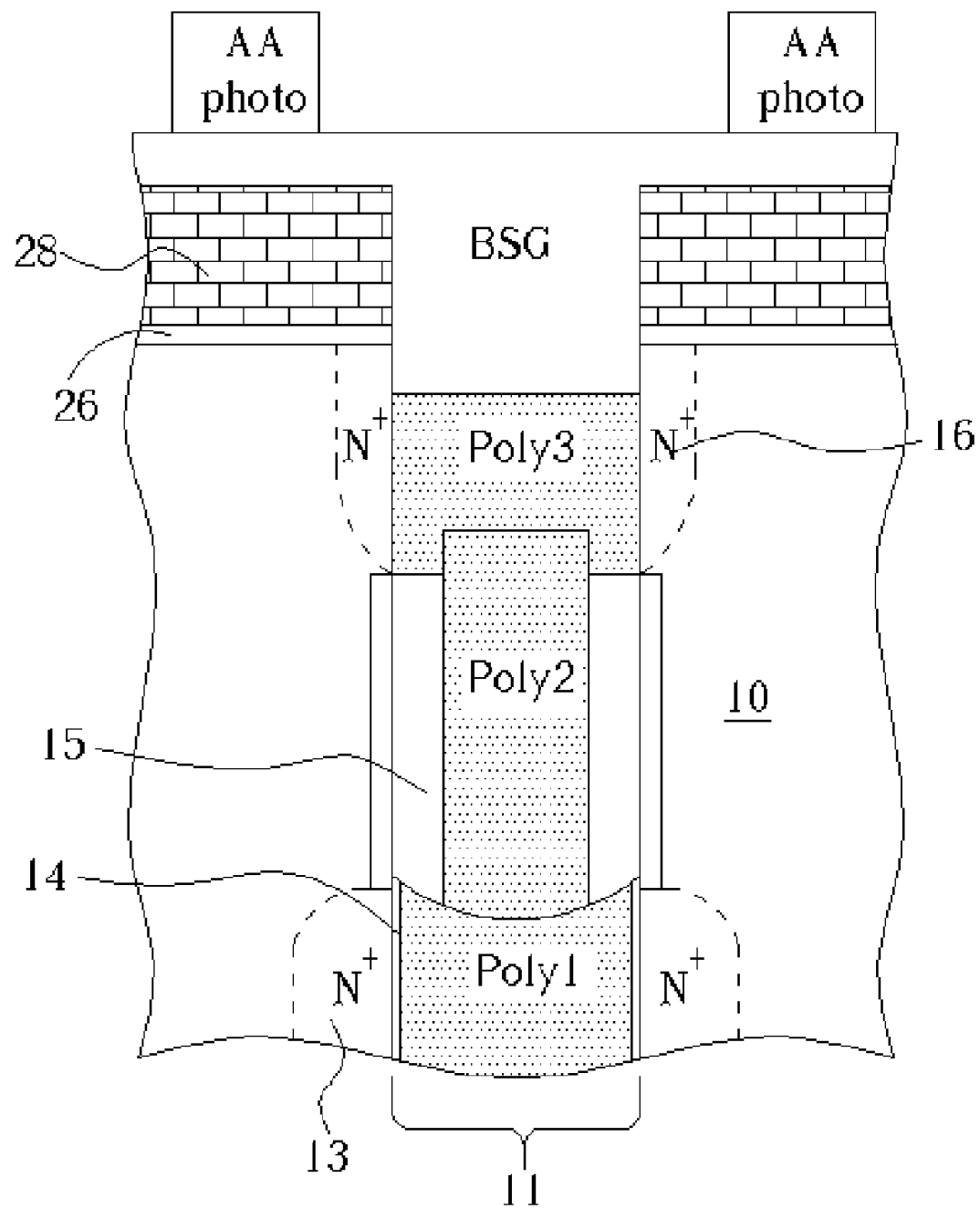
FIG. 5 is a schematic cross-sectional diagram showing the deep trench capacitor and the AA photo along line NN" of FIG. 4.
Figure 6:
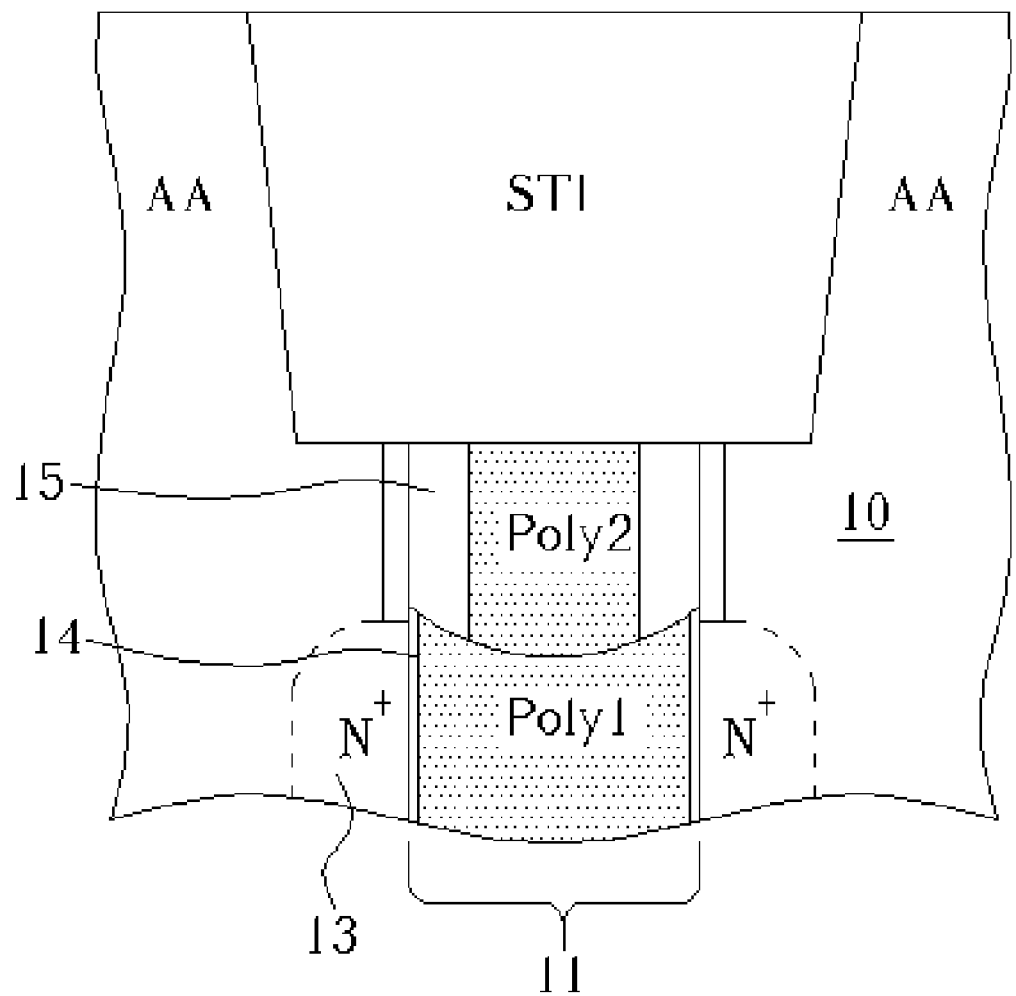
FIG. 6 is a schematic cross-sectional diagram showing the deep trench capacitor and the shallow trench isolation (STI) along line NN" of FIG. 4.
Figure 7:
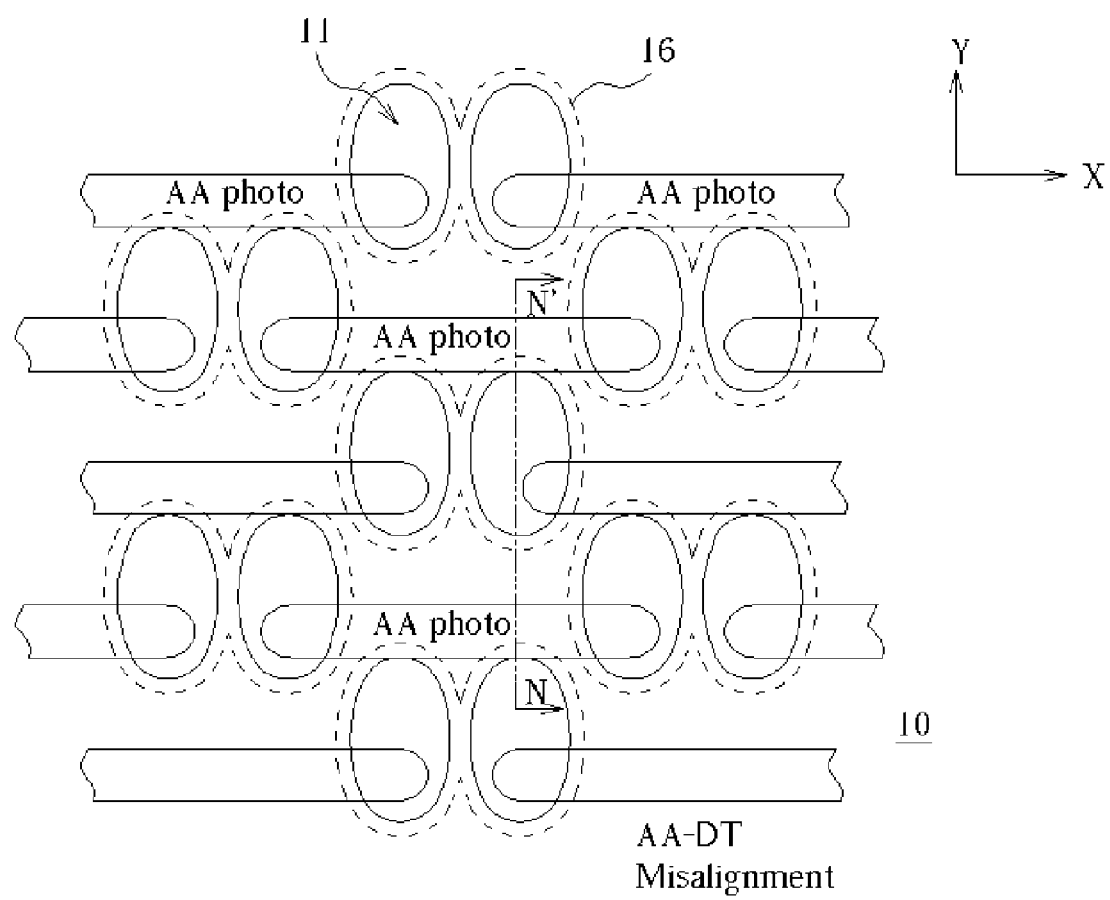
FIG. 7 is an enlarged schematic plane view showing, in a non-ideal condition, the layout of the deep trench (DT) capacitors and AA photo pattern with AA-DT misalignment.
Figure 8:
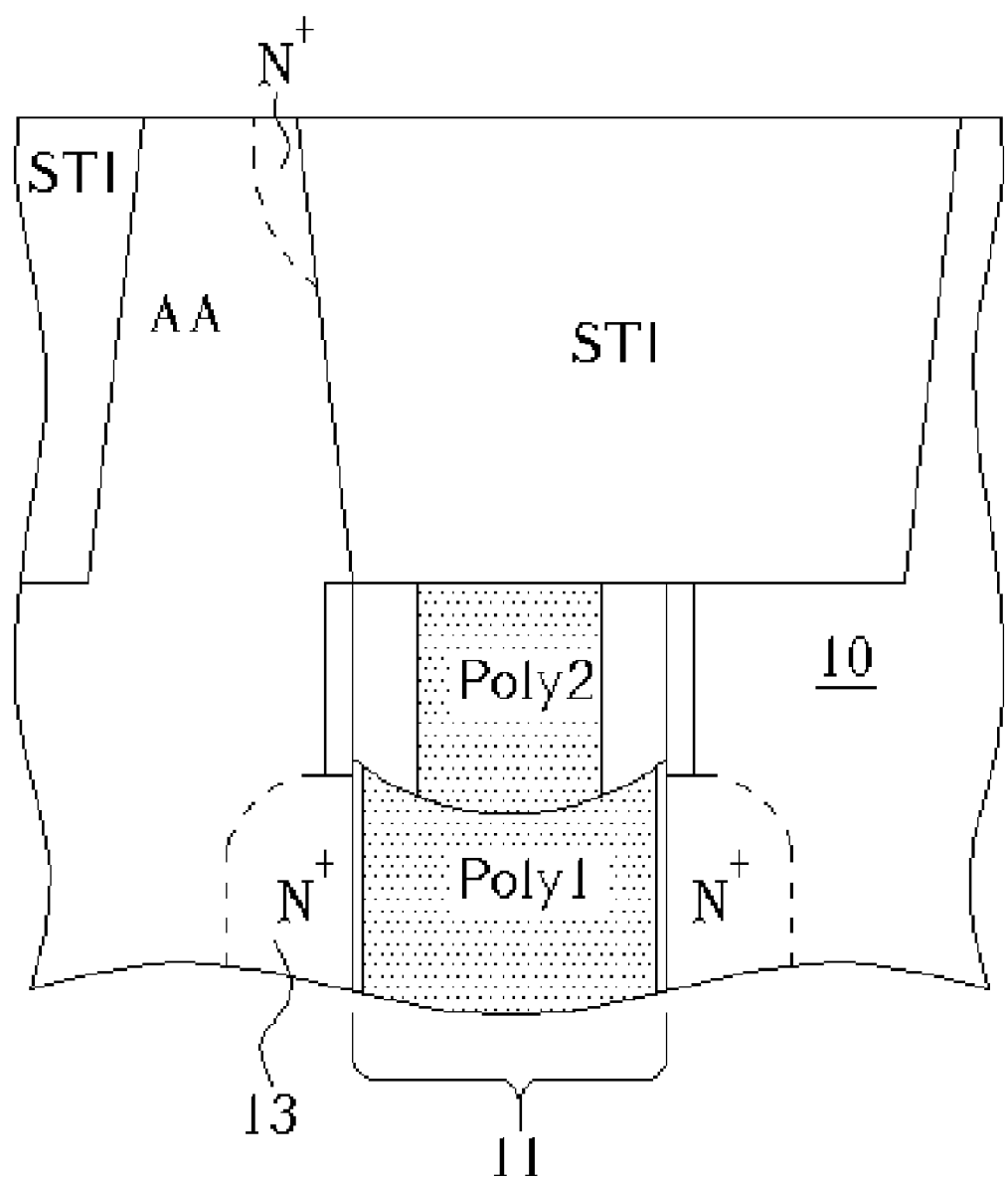
FIG. 8 is a schematic cross-sectional diagram showing the deep trench capacitor and the AA photo along line NN" of FIG. 7 (after STI process)
Figure 9:
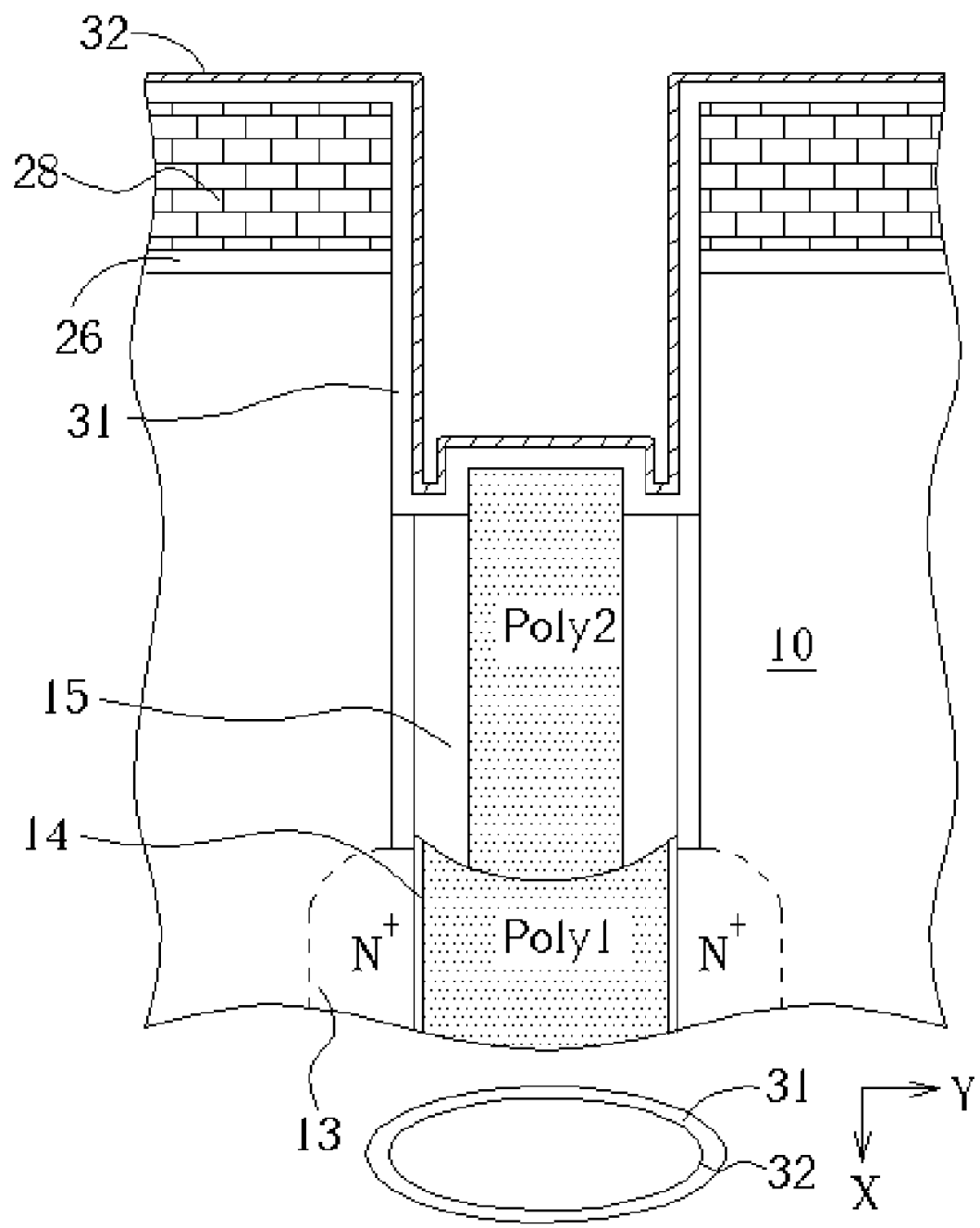
FIG. 9 to FIG. 14 are schematic cross-sectional diagrams illustrating the method for fabricating deep trench capacitor according to the preferred embodiment of the present invention.

Please refer to FIG. 9 to FIG. 14. FIG. 9 to FIG. 14 are schematic cross-sectional diagrams illustrating the method for fabricating deep trench capacitor according to the preferred embodiment of the present invention. As shown in FIG. 9, a semiconductor substrate 10 such as a silicon substrate is provided. A pad oxide layer 26 and a pad nitride layer 28 are formed on a surface of the semiconductor substrate 10. A deep trench etching is then carried out to form a deep trench in the substrate 10. The formation of a deep trench in a silicon substrate is known in the art. A dry etching process such as RIE is typically used to form a deep trench in the semiconductor substrate 10. A buried plate 13 adjacent to the deep trench and a node dielectric layer 14 are formed. A first polysilicon deposition and recess process is carried out to form a first poly layer (Poly1) inside the deep trench. A collar oxide layer 15 is formed on sidewall of the deep trench above Poly1. A second polysilicon deposition and recess process is then carried out to form a second poly layer (Poly2) atopPoly 1 and collar oxide. The method of forming the buried plate 13 comprises the steps of depositing a thin layer of arsenic silicate glass (ASG) at a lower portion of the deep trench, followed by thermal drive in. It is understood that other doping methods such as gas phase doping (GPD) or the like may be employed. The node dielectric layer 14 may be oxide-nitride (ON) or oxide-nitride-oxide (ONO), but not limited thereto. After performing the second polysilicon deposition and recess process, the trench sidewall, the top surface of Poly 2 and the exposed surface of the collar oxide layer 15 define a recess at the top of the deep trench.

Still referring to FIG. 9, a top view of the oval shaped deep trench capacitor is also illustrated at the lower portion of FIG. 9. Subsequently, a thin silicon oxide layer 31 is deposited on interior surface of the recess at the top of the deep trench, i.e., on the exposed trench sidewall, the exposed top surface of the collar oxide 15, and the top surface of Poly2. The conformal silicon oxide layer 31 also covers the pad nitride layer 28 and the exposed pad oxide layer 26. Preferably, the thin silicon oxide layer 31 is deposited using chemical vapor deposition (CVD) method and has a thickness of about 100~200 angstroms, preferably 150 angstroms. An amorphous silicon film 32 is then deposited on the conformal silicon oxide layer 31. The amorphous silicon film 32 has a thickness of about 50 angstroms.

Figure 10:
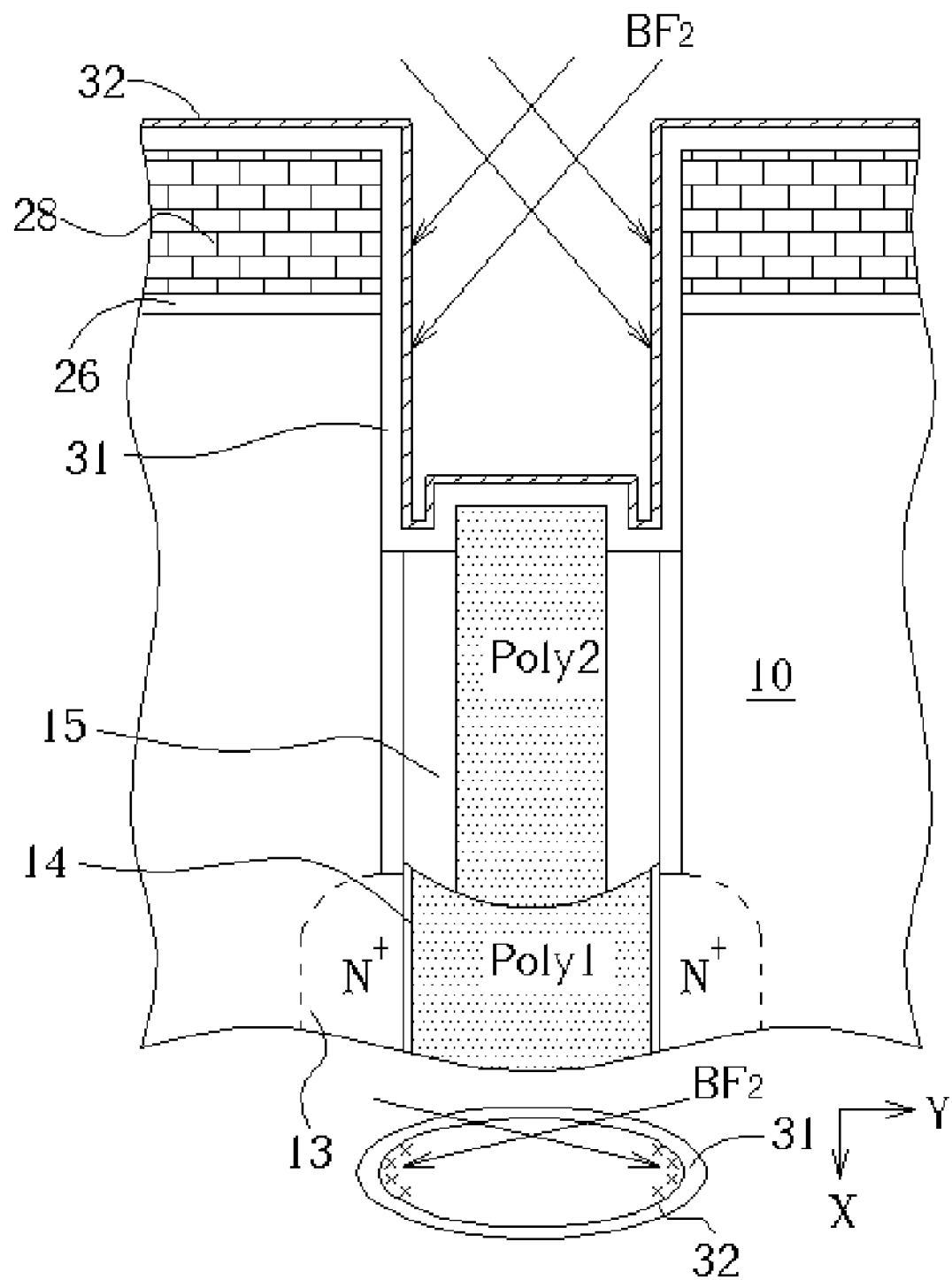

As shown in FIG. 10, a tilt angle ion implantation process is carried out in y direction to selectively implant dopants such as BF2 into the amorphous silicon film 32 coated on sidewall of the deep trench. It is noted that the tilt angle ion implantation process is performed only in y direction as specifically indicated in FIG. 9, but not performed in x direction. Therefore, dopants are not implanted into the amorphous silicon film 32 in x direction.

Figure 11:
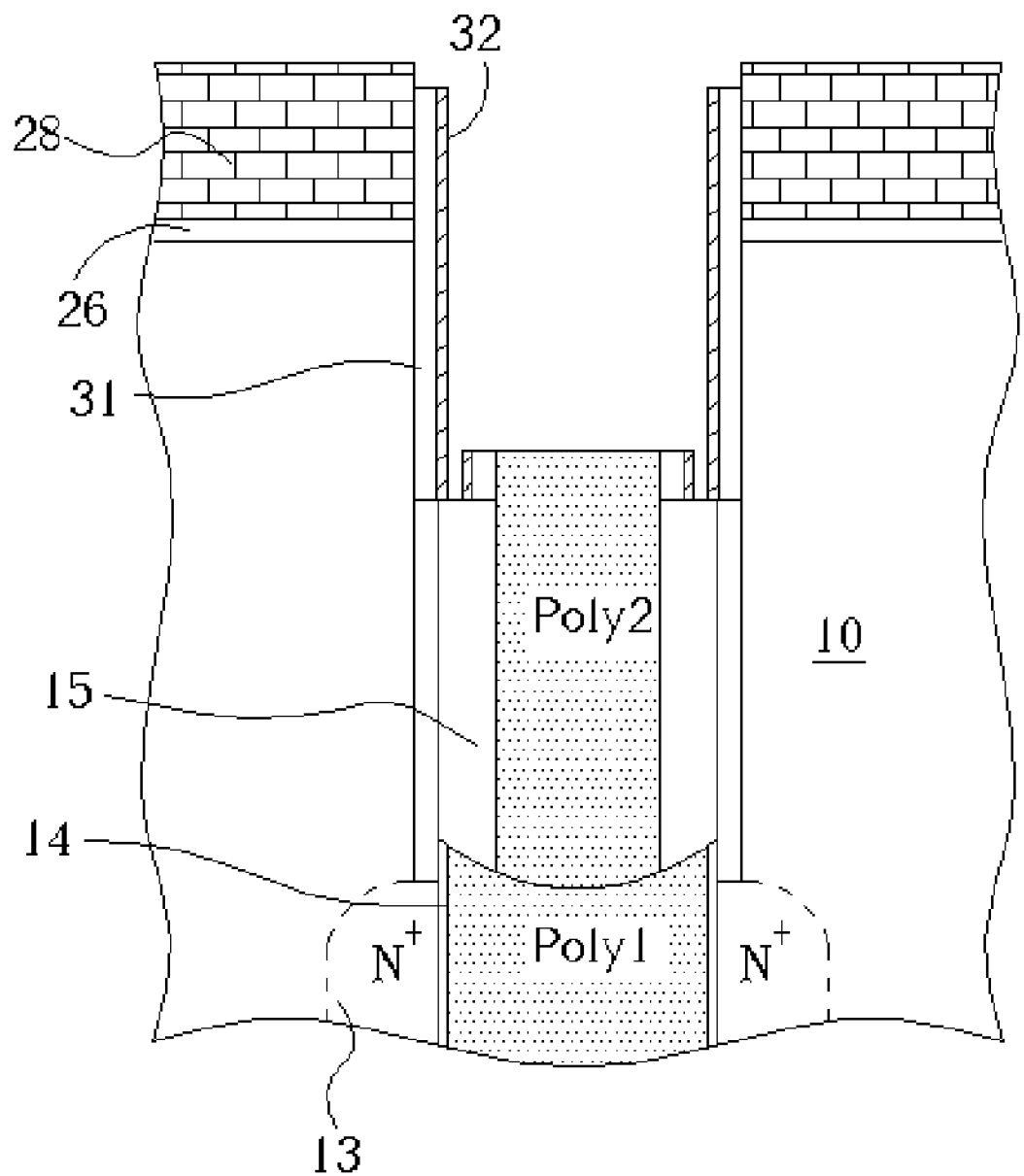

As shown in FIG. 11, an anisotropic etching is carried out to etch the amorphous silicon film 32 and the silicon oxide layer 31 deposited above the pad nitride layer 28 and the amorphous silicon film 32 deposited at the bottom of the recess, thereby exposing the pad nitride layer 28 and Poly2. The remaining amorphous silicon film 32 and silicon oxide layer 31 form a spacer on sidewall of the deep trench.

Figure 12:
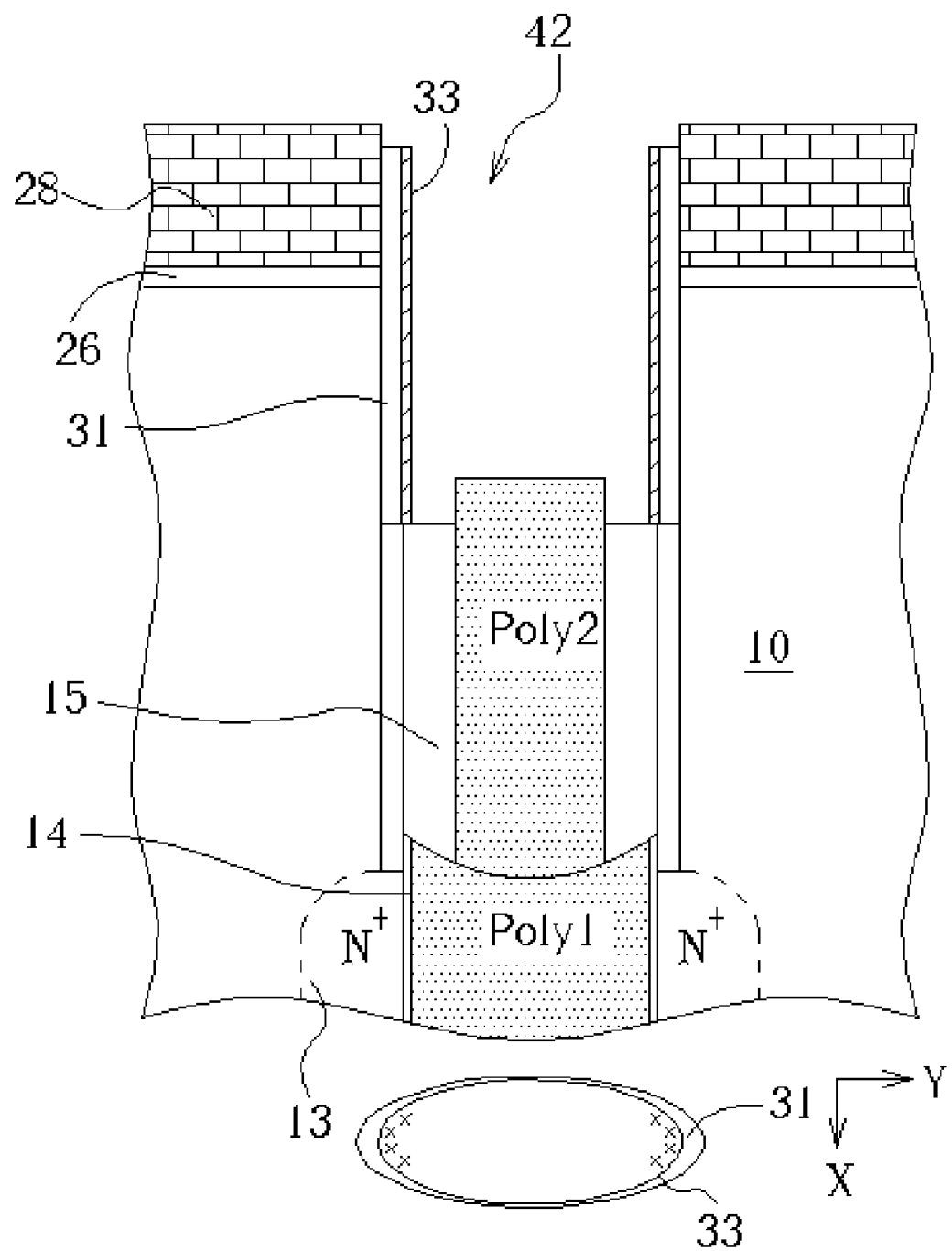

As shown in FIG. 12, a wet etching such as diluted ammonia solution is used to selectively etch away the nondoped portions (in x direction) of the remaining amorphous silicon film 32. The wet etching does not etch the doped portion (in y direction) of the amorphous silicon film 32. After the wet etching, the remaining portions of the amorphous silicon film 32 in y direction constitute a pair of symmetric spacers 33 on sidewall of the deep trench approximately above the collar oxide 15 and Poly2, thereby exposing the silicon oxide layer 31 in x direction. The exposed silicon oxide layer 31, which is not covered by the y-direction amorphous silicon spacers 33, is thereafter removed by using wet chemistry such as diluted HF, thereby exposing the silicon sidewalls in the deep trench in x direction. At this time, the surface of the y-direction amorphous silicon spacers 33, the exposed silicon sidewall, and the top surface of the collar oxide 15 and Poly 2 constitute a new recess opening 42 at the top of the deep trench capacitor.

Figure 13:
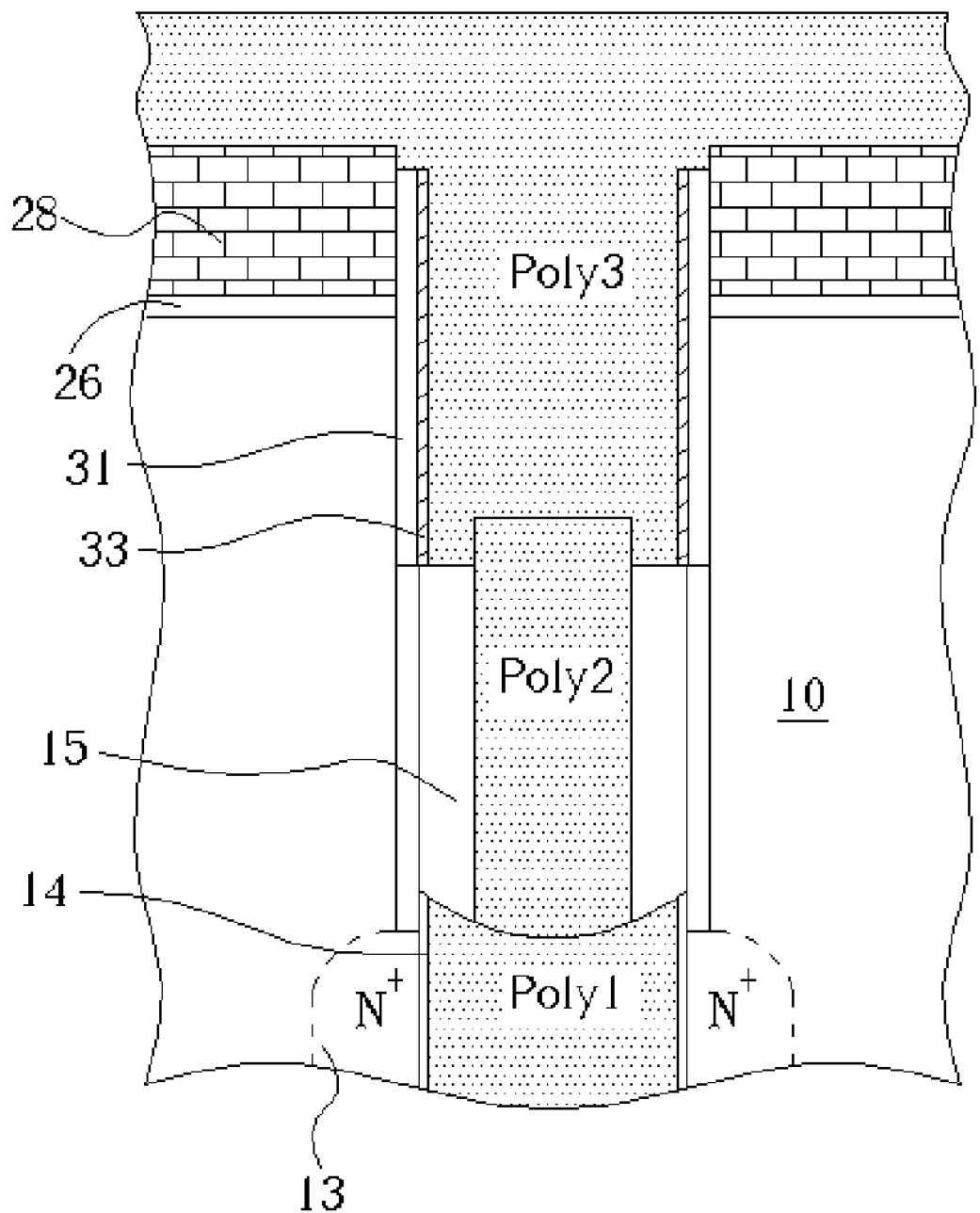
Figure 14:
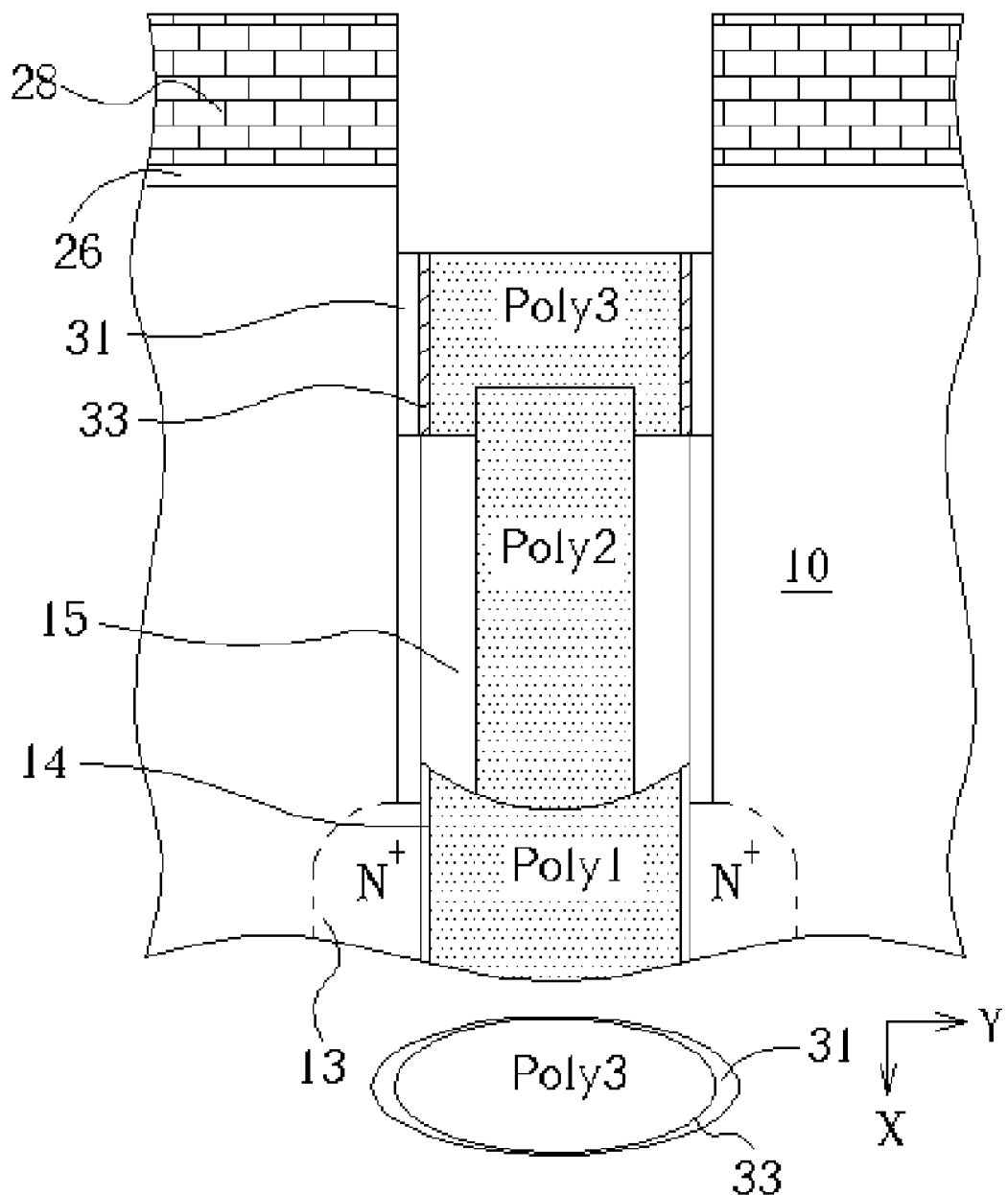

As shown in FIG. 13, a third polysilicon layer (Poly3) is deposited on the substrate and fills the recess opening 42. As shown in FIG. 14, Poly 3 and the y-direction amorphous silicon spacers 33 are then recessed to a predetermined depth, for example, 100~400 angstroms, below the surface of the substrate 10.

Figure 15:
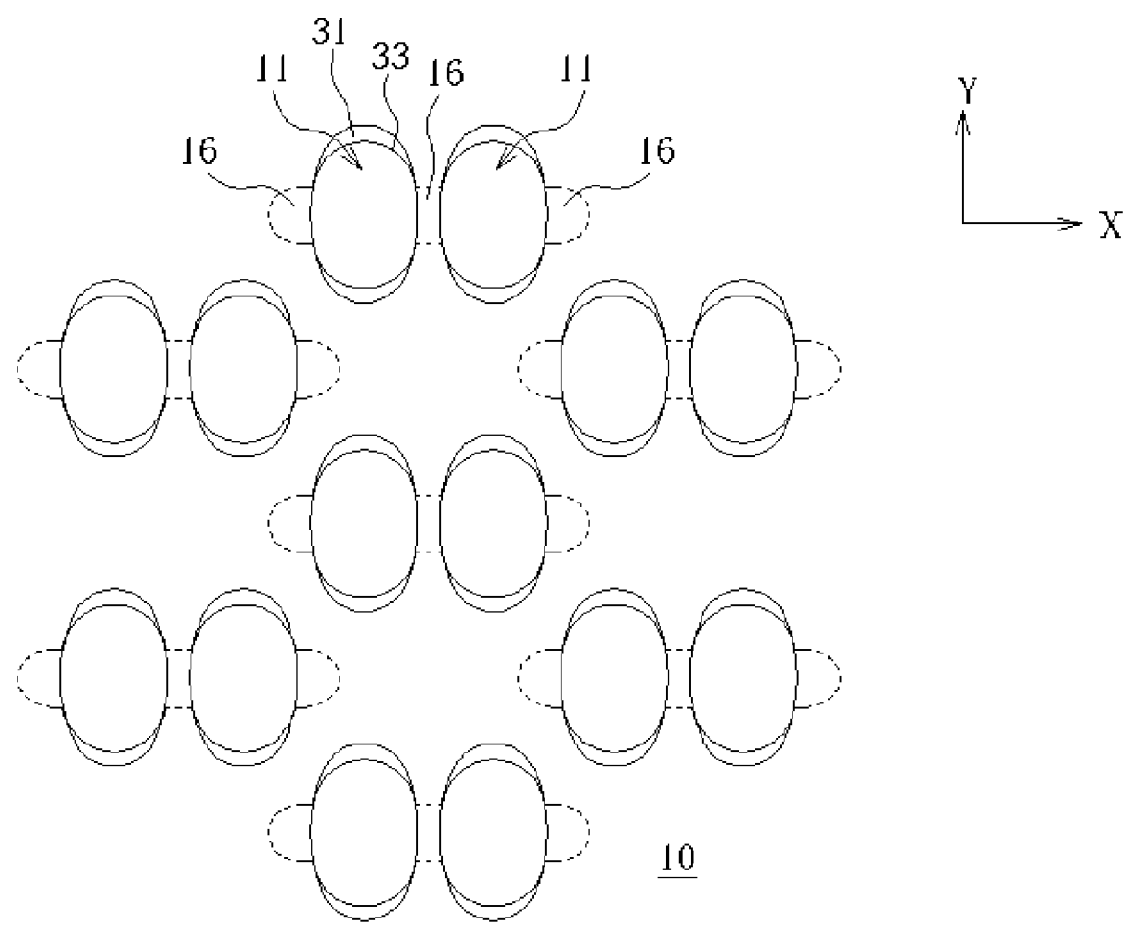
FIG. 15 is a schematic plane view showing the layout of the deep trench capacitors after finishing the process steps through FIG. 9 to FIG. 14 and buried strap out diffusion process, wherein the perspective non-circular buried strap out diffusion regions 16 are also shown.

Please refer to FIG. 15. FIG. 15 is a schematic plane view showing the layout of the deep trench capacitors 11 after finishing the process steps through FIG. 9 to FIG. 14 and buried strap out diffusion process, wherein the perspective non-circular buried strap out diffusion regions 16 are also shown. As shown in FIG. 15, since the amorphous silicon spacers 33 and the silicon oxide layer 31 covered by the amorphous silicon spacers 33 block the out diffusion path in y direction, the buried strap out diffusion regions 16 are only formed in x direction. This increases the process window when laying AA photo pattern. AA-DT misalignment is eliminated.

Those skilled in the art will readily observe that numerous modifications and alterations of the present invention may be made while retaining the teachings of the invention. Accordingly, the above disclosure should be construed as limited only by the metes and bounds of the appended claims.

What is claimed is:

1. A method for fabricating a trench capacitor, comprising:
    providing a substrate having a deep trench etched therein;
    doping the deep trench to form a buried plate electrode in the substrate adjacent to a lower portion of the deep trench;
    forming a node dielectric layer on interior surface of the deep trench;
    depositing a first conductive layer in the deep trench;
    recessing the first conductive layer to a first depth in the deep trench;
    forming a collar oxide layer on sidewall of the deep trench above the first conductive layer;
    depositing a second conductive layer on the first conductive layer and the collar oxide layer;
    recessing the second conductive layer to a second depth inside the deep trench;
    forming a pair of symmetric spacers on sidewall of the deep trench above the second conductive layer in a first direction and exposing a silicon sidewall of the deep trench above the second conductive layer in a second direction, wherein the first direction is substantially orthogonal to the second direction;
    depositing a third conductive layer on the second conductive layer and on the spacers; and
    recessing the third conductive layer to a third depth inside the deep trench.

2. The method of claim 1 wherein after recessing the third conductive layer to a third depth inside the deep trench, the method further comprises the following step:
    out diffusing dopants of the second conductive layer to the silicon sidewall in the second direction via the third conductive layer, thereby forming a buried strap out diffusion region that is used to electrically connect the deep trench capacitor with a source region of an access transistor, wherein out diffusion of the dopants of the second conductive layer in the first direction is blocked by the spacers.

3. The method of claim 1 wherein the method of forming a pair of symmetric spacers on sidewall of the deep trench above the second conductive layer in a first direction comprises the following steps:
    depositing a thin dielectric layer on sidewall of the deep trench and on the second conductive layer;
    depositing a thin amorphous silicon layer on the thin dielectric layer;
    performing a tilt angle ion implantation process to selectively and symmetrically implant P type ions into the thin amorphous silicon layer on the sidewall of the deep trench in the first direction;
    anisotropic etching the thin amorphous silicon layer and the thin dielectric layer, thereby exposing the second conductive layer;
    selectively etching the thin amorphous silicon layer that is not ion implanted with the P type ions; and
    removing the thin dielectric layer that is not covered by the remaining thin amorphous silicon layer, thereby forming the symmetric spacers and exposing the silicon sidewall.

4. The method of claim 3 wherein the P type ions are $BF_2$ ions.

5. The method of claim 3 wherein the method of selectively etching the thin amorphous silicon layer that is not ion implanted with the P type ions comprises the use of diluted ammonia solution.

6. The method of claim 3 wherein the thin dielectric layer is a CVD silicon oxide layer.

7. The method of claim 3 wherein the thin dielectric layer has a thickness of about 100~200 angstroms.

8. The method of claim 3 wherein the thin amorphous silicon layer has a thickness of about 50 angstroms.

9. The method of claim 1 wherein the first conductive layer is made of polysilicon.

10. The method of claim 1 wherein the second conductive layer is made of polysilicon.

11. The method of claim 1 wherein the third conductive layer is made of polysilicon.

* * * * *